United States Patent
Lin et al.

(10) Patent No.: US 11,878,424 B2
(45) Date of Patent: Jan. 23, 2024

(54) POINT SET INTERFERENCE CHECK

(71) Applicant: FANUC CORPORATION, Yamanashi (JP)

(72) Inventors: Hsien-Chung Lin, Fremont, CA (US); Yongxiang Fan, Union City, CA (US); Tetsuaki Kato, Fremont, CA (US)

(73) Assignee: FANUC CORPORATION, Yamanashi (JP)

( * ) Notice: Subject to any disclaimer, the term of this patent is extended or adjusted under 35 U.S.C. 154(b) by 240 days.

(21) Appl. No.: 17/457,777

(22) Filed: Dec. 6, 2021

(65) Prior Publication Data

US 2023/0173674 A1    Jun. 8, 2023

(51) Int. Cl.
*B25J 9/16*    (2006.01)
*G06F 30/10*    (2020.01)

(52) U.S. Cl.
CPC .......... *B25J 9/1664* (2013.01); *B25J 9/1605* (2013.01); *G06F 30/10* (2020.01)

(58) Field of Classification Search
CPC ...... B25J 9/1664; B25J 9/1605; B25J 9/1666; G06F 30/10; G05B 2219/40442
See application file for complete search history.

(56) References Cited

U.S. PATENT DOCUMENTS

| 5,150,452 A * | 9/1992 | Pollack | B25J 9/1676 |
| | | | 700/255 |
| 5,347,459 A | 9/1994 | Greenspan et al. | |
| 8,315,738 B2 | 11/2012 | Chang et al. | |
| 9,550,295 B2 | 1/2017 | Shiratsuchi | |
| 9,862,094 B2 | 1/2018 | Nakajima et al. | |
| 10,071,480 B2 | 9/2018 | Nishi et al. | |
| 11,014,239 B2 | 5/2021 | Fujii et al. | |

(Continued)

FOREIGN PATENT DOCUMENTS

| CN | 111546377 A | 8/2020 |
| JP | 5025598 B2 | 9/2012 |

(Continued)

OTHER PUBLICATIONS

Pan, Jia, Sachin Chitta, and Dinesh Manocha. "FCL: A general purpose library for collision and proximity queries." 2012 IEEE International Conference on Robotics and Automation. IEEE, 2012.

*Primary Examiner* — Adam R Mott
*Assistant Examiner* — Matthew C Gammon
(74) *Attorney, Agent, or Firm* — John A. Miller; Shumaker, Loop & Kendrick, LLP

(57) ABSTRACT

A robot interference checking motion planning technique using point sets. The technique uses CAD models of robot arms and obstacles and converts the CAD models to 3D point sets. The 3D point set coordinates are updated at each time step based on robot and obstacle motion. The 3D points are then converted to 3D grid space indices indicating space occupied by any point on any part. The 3D grid space indices are converted to 1D indices and the 1D indices are stored as sets per object and per time step. Interference checking is performed by computing an intersection of the 1D index sets for a given time step. Swept volumes are created by computing a union of the 1D index sets across multiple time steps. The 1D indices are converted back to 3D coordinates to define the 3D shapes of the swept volumes and the 3D locations of any interferences.

20 Claims, 6 Drawing Sheets

(56) References Cited

U.S. PATENT DOCUMENTS

| | | | |
|---|---|---|---|
| 11,532,117 B2* | 12/2022 | Moloney | B64C 39/024 |
| 2009/0326711 A1 | 12/2009 | Chang et al. | |
| 2012/0215351 A1* | 8/2012 | McGee | B25J 9/1676 |
| | | | 700/248 |
| 2013/0297574 A1* | 11/2013 | Thiyanaratnam | G06T 9/005 |
| | | | 707/693 |

FOREIGN PATENT DOCUMENTS

| | | |
|---|---|---|
| JP | 20200082285 A | 11/2020 |
| WO | 2021049028 A1 | 3/2021 |

* cited by examiner

POINT SET INTERFERENCE CHECK

BACKGROUND

Field

The present disclosure relates to the field of industrial robot motion control and, more particularly, to a robot interference checking motion planning technique which defines robots and obstacles as point sets, updates three-dimensional (3D) point set coordinates based on robot and obstacle motion, converts 3D points to 3D indices indicating occupied space, converts the 3D indices to 1D indices and stores the 1D indices as sets per object and per time step, performs an interference check computation by intersection of the sets for a given time step, and performs a swept volume computation by union of the sets across multiple time steps.

Discussion of the Related Art

The use of industrial robots to perform a wide range of manufacturing, assembly and material movement operations is well known. In many robot workspace environments, obstacles are present and may be in the path of the robot's motion. The obstacles may be permanent structures such as machines and fixtures, or the obstacles may be temporary or mobile. A large workpiece which is being operated on by the robot may itself be an obstacle, as the robot must maneuver in or around the workpiece while performing an operation such as welding. In multi-robot workspace environments, each robot is a potential obstacle for other robots. Collisions between any part of the robot and any obstacle must absolutely be avoided.

It is known to include interference checking algorithms in motion planning routines, including during real-time motion planning. One prior art technique for interference checking involves defining geometry primitives—such as spheres, cylinders, etc.—around each arm of the robot and around each obstacle. Geometry primitives are used in order to reduce the complexity of the interference checking calculation to a manageable level so that it can be performed quickly enough for real-time motion planning. However, defining the geometry primitives around each obstacle and each robot arm is a tedious and time-consuming process. Furthermore, some objects, such as a vehicle body which is being welded or painted by the robot, do not lend themselves well to approximation using geometry primitives. Even the robot arms themselves are often not well approximated using geometry primitives, and conservative geometry primitive shapes can lead to false positive interference conditions.

Another prior art technique for interference checking uses CAD models of the robot arms and obstacles. Using CAD models in interference checking calculations avoids the inaccuracy problem of geometry primitives. However, this method requires calculating distances and detecting interferences between all locations on one CAD model (e.g., a robot end effector) and all locations on the CAD models of every other potential obstacle in the workspace (including all other robot arm parts, machines, fixtures, workpieces, etc.). This calculation is compute-intensive and slow for all except the simplest robot workspace environments. In most cases, the collision avoidance calculations take too long to be practical in an environment where motion planning computations must be performed in real time as the robot operates.

In light of the circumstances described above, there is a need for an improved robot interference checking technique which is easy to set up and which computes collision-avoiding robot motion quickly and accurately regardless of the number or type of obstacles in the robot workspace.

SUMMARY

In accordance with the teachings of the present disclosure, a robot interference checking motion planning technique using point sets is disclosed. The technique uses CAD models of robot arms and obstacles and converts the CAD models to 3D points. The 3D points are updated at each time step based on robot and obstacle motion. The 3D points are then converted to 3D grid space indices indicating space occupied by any of the points on any part. The 3D grid space indices are then converted to 1D indices and the 1D indices are stored as a set per object and per time step. Swept volumes are created by computing a union of the 1D index sets across multiple time steps. Interference checking is performed by computing an intersection of the 1D index sets for a given time step or given swept volumes. The 1D indices are converted back to 3D coordinates to define the 3D shapes of the swept volumes and the 3D locations of any interferences.

Additional features of the presently disclosed devices and methods will become apparent from the following description and appended claims, taken in conjunction with the accompanying drawings.

DETAILED DESCRIPTION OF THE EMBODIMENTS

The following discussion of the embodiments of the disclosure directed to robot interference checking using point sets represented as 1D indices is merely exemplary in nature, and is in no way intended to limit the disclosed devices and techniques or their applications or uses.

It is well known to use industrial robots for a variety of manufacturing, assembly and material movement operations. In many robot workspace environments, obstacles are present and may be in the path of the robot's motion—that is, the obstacles may be located between where a robot is currently positioned and the robot's destination position. The obstacles may be permanent structures such as machines and fixtures, or the obstacles may be temporary or mobile. A large workpiece which is being operated on by the robot may itself be an obstacle, as the robot must maneuver in or around the workpiece while performing an operation such as welding. One robot in a workspace can also be a potential obstacle to another robot. Techniques have been developed in the art for computing robot motions such that the tool follows a path which avoids collision of any part of a robot with any obstacles.

Figure 1A:
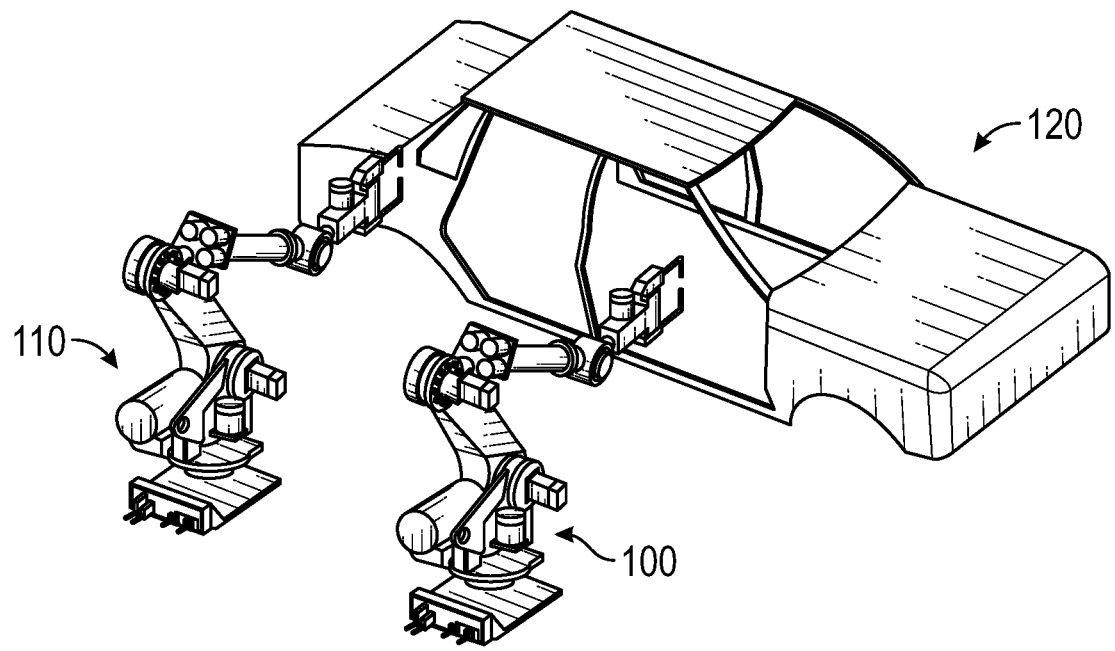
FIG. 1A is an illustration of two industrial robots working near a vehicle body workpiece which is itself an obstacle.

FIG. 1A is an illustration of two industrial robots (100, 110) working near a vehicle body workpiece 120. In the workspace of FIG. 1A, the robots 100 and 110 are performing spot welding tasks on various locations of the workpiece 120. The spot welding includes locations in the interior of the vehicle body, requiring the robots 100 and 110 to reach inside the door openings. In this application, the vehicle body workpiece 120 is itself an obstacle to the motion of the robots 100 and 110. In addition, the robots 100 and 110 may have overlapping motions, which means that the robots 100 and 110 may be obstacles to each other. Operation of the robots 100 and 110 requires interference check calculations to be performed for all planned motions.

Figure 1B:
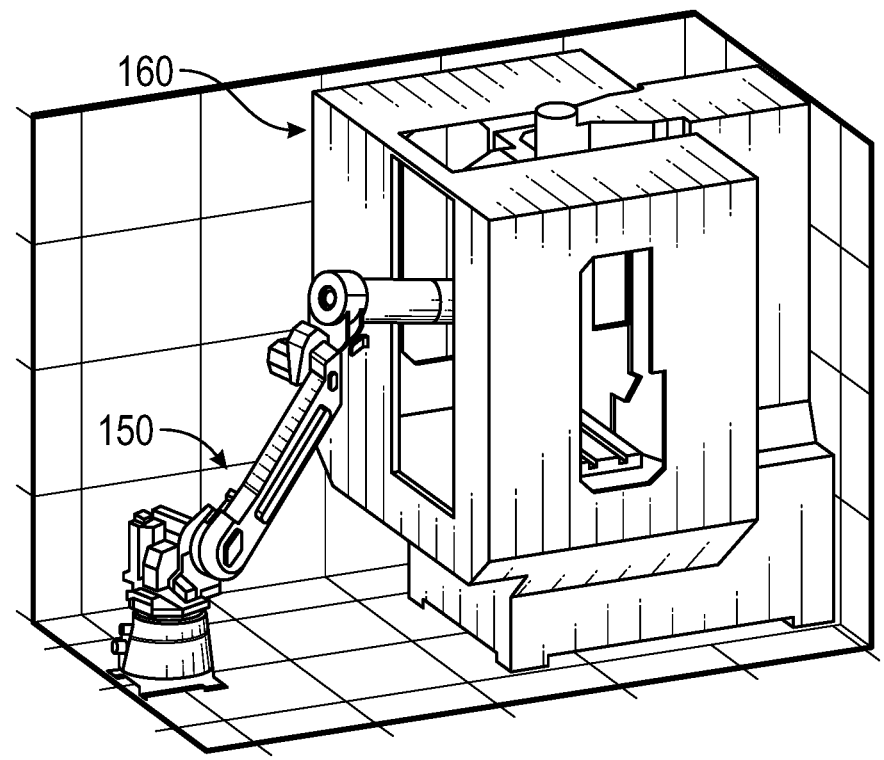
FIG. 1B is an illustration of an industrial robot in a machine tending application where the machine is an obstacle.

FIG. 1B is an illustration of an industrial robot 150 in a machine tending application, where the robot 150 places raw parts in a fixture inside a machine 160 and subsequently removes finished parts from the fixture. In this application, the robot 150 is required to reach inside the machine 160, and therefore the machine 160 is a potential obstacle to robot motion. Again, operation of the robot 150 requires interference check calculations to be performed in advance for all planned motions.

One prior art technique for interference checking in robot motion planning involves defining geometry primitives— such as spheres, cylinders, etc.—around each arm of the robot(s) and around each obstacle. Geometry primitives are used in order to reduce the complexity of the interference checking calculation to a manageable level by approximating the real object geometries with simplified shapes.

Then, to calculate robot motions which avoid interference, distances are calculated from the robot arm primitives to the obstacle primitives, which is much simpler than calculating distances between actual detailed shapes of the arms and obstacles. However, defining the geometry primitives around each obstacle and each robot arm is a tedious and time-consuming process. In addition, because real robot arm parts and real obstacles typically have irregular shapes, the geometry primitives are often defined with significant empty space within the volume of the primitives. This causes the resulting interference check calculations to sometimes return false positive interferences.

Furthermore, some objects do not lend themselves well to approximation using geometry primitives. For example, in FIG. 1A, the vehicle body workpiece 120 is not readily modeled in terms of geometry primitives. It would be possible to define a hexahedron ("brick shape") geometry primitive around the vehicle body workpiece 120 to prevent collision by the robots 100/110, but the hexahedron would contain a large amount of free space around the vehicle body, and the free space would prevent the robots 100/110 from being able to reach inside the vehicle body workpiece 120. The alternative would be to define a large number of geometry primitives approximating the shape of the vehicle body workpiece 120 (e.g., a cylinder primitive for the windshield "A" pillar, another cylinder primitive for the door "B" pillar, etc.), which would be a prohibitively tedious and time-consuming process, and would still be overly conservative.

Another prior art technique for interference checking in robot motion planning uses actual geometry of robot arms, workpieces and other obstacles in the form of CAD models. This technique avoids the inaccuracies of the geometry primitive method, but computation time for the interference check calculations increases dramatically for all but the simplest scenarios of robot/obstacles workspaces. Interference checking computations using CAD models typically takes too long to be practical in a real-time environment where motion planning calculations must be made continuously and quickly.

Other techniques for interference checking in robot motion planning also exist—including a signed distance field technique, and an axis-aligned bounding box tree technique. However, all of the techniques mentioned above exhibit some combination of being computationally-intensive (and thus slow), being inaccurate due to approximations, or requiring a tremendous amount of computer memory to store 3D position information for all parts at all time steps in the motion program.

To overcome the problems described above, a new robot interference checking technique using point sets represented as 1D indices is disclosed herein. The point set interference checking technique of the present disclosure provides fast computation of interferences and swept volumes without the inaccuracies associated with using geometry primitives. The disclosed interference check technique does not require storage of 3D geometry or grid data for all positions/time steps, and is fast enough to be included in real-time robot motion planning routines.

Figure 2:
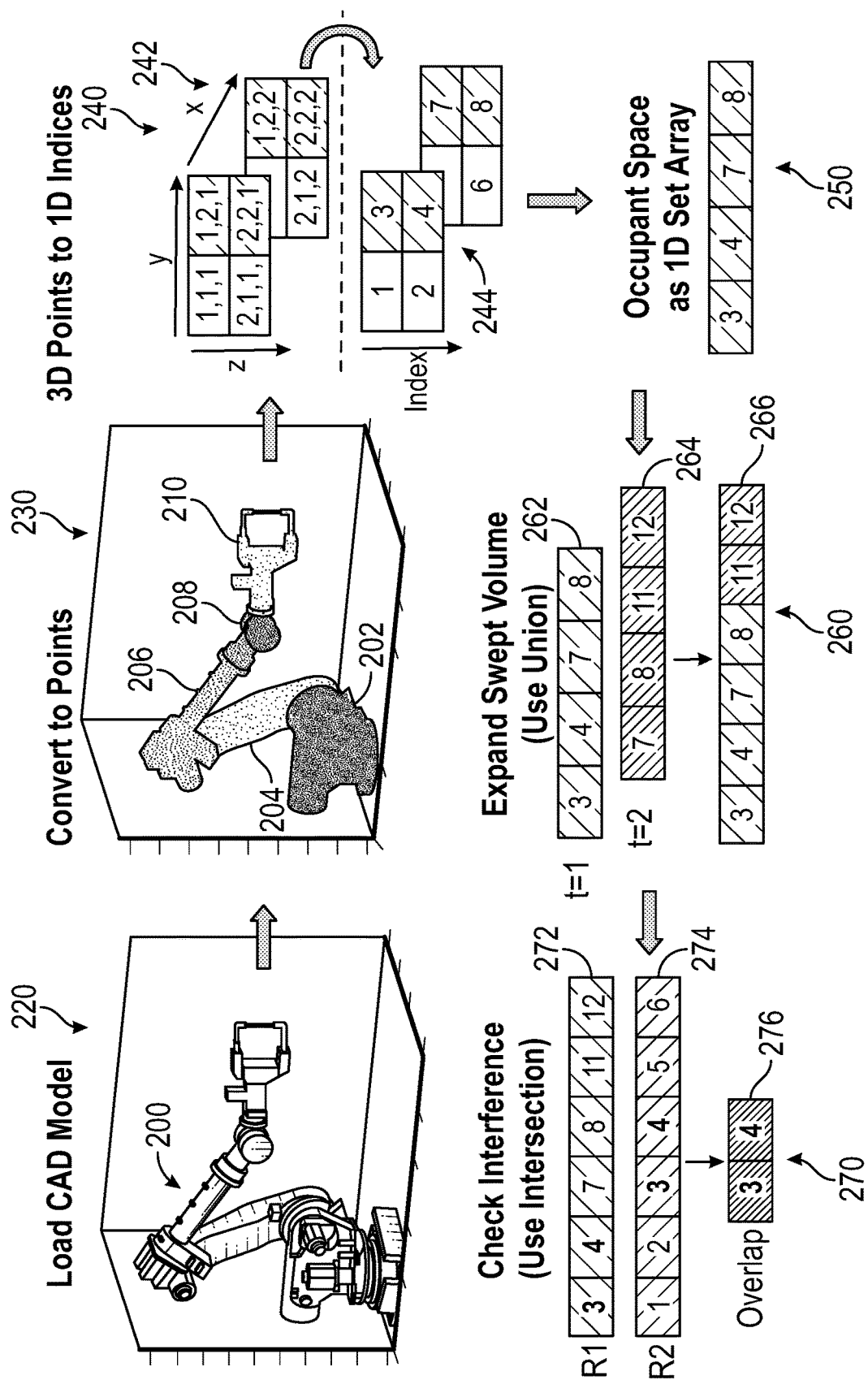
FIG. 2 is an illustration of steps in a point set method for interference checking, including converting object 3D points to 1D indices, according to an embodiment of the present disclosure.

FIG. 2 is an illustration of steps in a point set method for interference checking, including converting object 3D points to 1D indices, according to an embodiment of the present disclosure. At step 220, CAD models of the parts of a robot 200 are provided, along with CAD models of any potential obstacles in the workspace, and CAD models of parts being operated on. The CAD models are preferably 3D solid models, but may also be surface models, as known in the art. At step 230, the CAD models are converted to 3D points. This is done by defining a plurality of points on the surfaces and in the interior of each of the individual parts. For example, a robot base part 202 may be represented by several hundred points, and likewise for an inner arm 204, an outer arm 206, a wrist part 208 and an end-effector 210. The number of arm parts in the robot 200 may vary, and the number (density) of points per part may be selected to suit application requirements. Again, the 3D points are defined for each part individually, so that the point coordinates can be updated to account for motion of the robot 200 (and possibly other robots in the workcell). The same is true for workpiece points—where the vehicle body 120 of FIG. 1A may be moving on a conveyor, and the machine 160 of FIG. 1B may have doors which open and close. The 3D points on each part are transformed to new coordinates for each time step of planned motion. The steps 220 and 230 are performed in an initialization phase, which may be done "offline" before the actual point set interference check calculations.

At step 240, the 3D points for each part are converted to 1D indices. Each 1D index is simply a single integer number representing a grid cell in the robot workcell or workspace. Converting the 3D points to 1D indices is a two-step process, where the 3D point coordinates are first converted to 3D grid space indices (at 242), and the 3D indices are then converted to 1D indices (at 244). At step 250, the 1D indices, which designate grid space occupancy, are stored per part and per time step. For example, each of the points on the end-effector 210 occupies a 3D grid space index which is converted to a 1D index, and all of the occupied 1D indices for the end-effector part 210 are stored for each time step. The same is done for each part of the robot(s) and for all obstacles and workpieces which may be obstacles, where some of the obstacles and workpieces may be fixed and some may be moving. By storing only occupied 1D indices, the disclosed method uses very little computer memory compared to prior art techniques, and subsequent interference check and swept volume computations are extremely efficient. The steps 240 and 250 will be discussed in detail in the discussion of FIG. 3 below.

At step 260, the occupied 1D indices for all time steps are combined in a union operation to generate a swept volume. The swept volume can be computed for each individual part; however, in the case of a robot, it is more common to compute the swept volume for the entire robot. For example, a swept volume can be computed for the robot 200 by combining the occupancy indices for the base part 202, the inner arm 204, the outer arm 206, the wrist part 208 and the end-effector 210. The step 260 of FIG. 2 shows a simplified example of this. At 262, the occupied 1D indices for a time step t=1 are shown, and at 264, the occupied 1D indices for a time step t=2 are shown. The occupied 1D indices at 262 and 264 are for the same part or the same robot (not two different robots, and not a robot compared to a workpiece). At time step t=1, the part occupies index numbers (3, 4, 7, 8). At time step t=2, the same part occupies index numbers (7, 8, 11, 12). A union of the occupied indices from the time steps t=1 and t=2 results in a total swept volume represented by (3, 4, 7, 8, 11, 12) as indicated at 266. The swept volume represented as 1D indices can be transformed back into a 3D geometry swept volume by reversing the steps 230 and 240.

At step 270, the occupied 1D indices for two different parts (e.g., two robots, or a robot vs. a workpiece) are used in an intersection operation to determine if an interference exists. In the case of a dual-robot system, it is common to check for interference between one entire robot and another entire robot. The step 270 of FIG. 2 shows a simplified example of this. At 272, the occupied 1D indices for a robot R1 are shown, and at 274, the occupied 1D indices for a robot R2 are shown. The occupied 1D indices at 272 and 274 are for the same single time step. For the robot R1, the occupied index numbers are (3, 4, 7, 8, 11, 12). For the robot R2, the occupied index numbers are (1, 2, 3, 4, 5, 6). An intersection of the occupied indices for the robots R1 and R2 results in an interference represented by indices (3, 4) as indicated at 276. The interference represented as 1D indices can be transformed back into a 3D geometry interference volume by reversing the steps 230 and 240.

The point set interference check method of FIG. 2 may be used in a robot motion planning application, where the motion of a robot (or more than one robot) relative to workpieces and obstacles is planned and evaluated before the task is executed by the robot(s). For example, in FIG. 1A, the motions of the robots 100 and 110 required in order to complete all of the spot welds on the vehicle body workpiece 120 can be computed before the robots 100/110 actually start the welding. If an interference condition is identified between the robots 100/110, or between one of the robots and the workpiece 120, then the planned motion can be adjusted to prevent the interference—such as by delaying the start of one of the robots' motion sequences. Likewise, swept volumes can be used to determine if one robot's motion overlaps with the other robot's motion over the entire motion sequence, and if the resultant overlap volume is undesirable, a different motion plan can be computed.

It is to be understood that all of the steps of the point set interference check method shown in FIG. 2 are programmed in an algorithm which runs on a computer having a processor and memory. In a preferred embodiment, the computer which runs the point set interference check method is a robot controller which has access to real time robot configuration (joint position) data and is also responsible for computing the robot motion plan. However, other system designs are possible—such as where the computer running the point set interference check method is a workcell controller which communicates with multiple robot controllers and also knows the position of a workpiece on a conveyor (in the example of FIG. 1A) or the status of doors and parts in a machining station (in the example of FIG. 1B). In addition to the robot controller(s) and possibly a workcell controller computer, the system may include one or more object sensors to identify obstacles moving within the workcell. In some embodiments, no object sensors are needed, as the robot controller and/or the workcell controller know the position of moving workpieces (e.g., on a conveyor) or the status of a machine being tended (e.g., part loading/unloading status, door opening/closing status).

Figure 3:
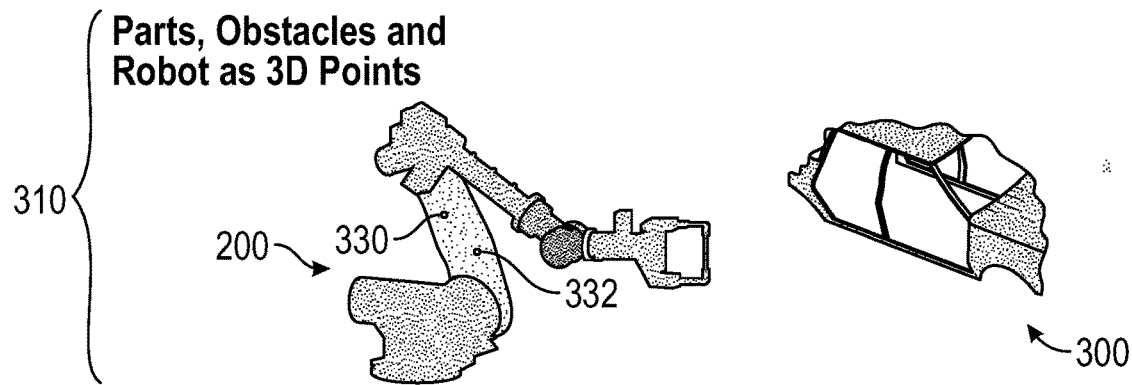
FIG. 3 is an illustration of portions of the method shown in FIG. 2, depicting details of the steps for converting object 3D points to 1D indices, according to an embodiment of the present disclosure.
Figure 3:
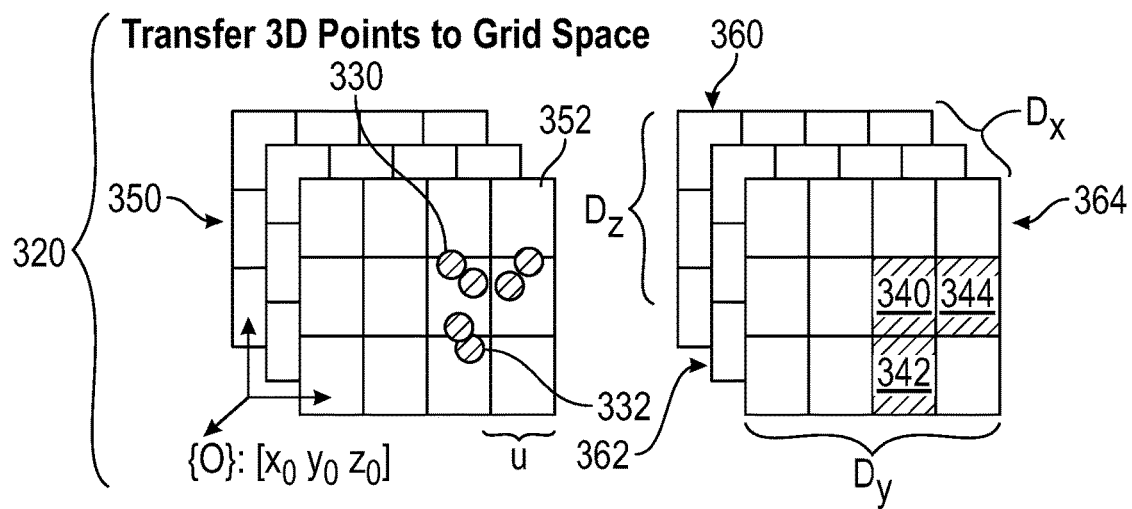
Figure 3:
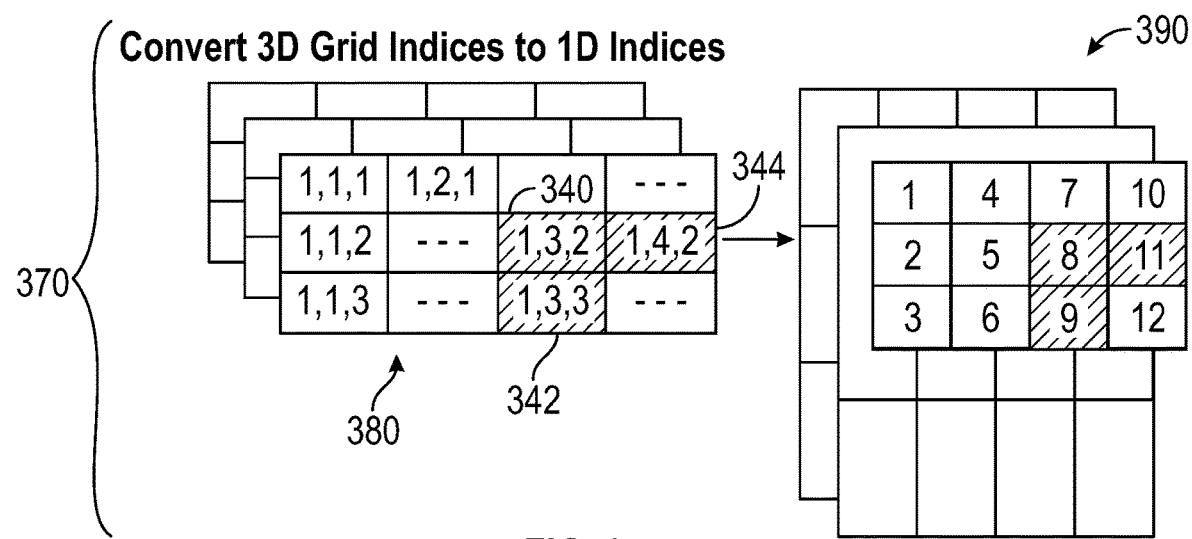

FIG. 3 is an illustration of portions of the point set interference check method shown in FIG. 2, depicting details of the steps for converting object 3D points to 1D indices, according to an embodiment of the present disclosure. At step 240 of FIG. 2, the 3D points for each part are converted to 1D indices in a two-step process, where the 3D point coordinates are first converted to 3D grid space indices, and the 3D indices are then converted to 1D indices. These are the steps that are detailed in FIG. 3.

In section 310, the robot(s) and any other objects that may be obstacles (such as workpieces and fixtures in the workspace) are defined as 3D points. The points for each part of the robot(s) and each other object are transposed to a location corresponding to a time step of a motion plan. For example, in a two-robot system, a configuration (joint angles) for each robot is computed for each time step of the motion plan, and the various parts of the robots are transposed to their position and orientation in workspace coordinates, so that each point on each part can likewise be transposed. This transposition can be performed using a forward kinematics calculation in a manner known in the art, such as: $[x\ y\ z] = R_{jnt}\ p + p_{jnt}$, where $[x\ y\ z]$ are the updated 3D coordinates of a point p, $R_{jnt}$ is the joint coordinate frame orientation, p is the point p in the coordinates of the joint frame, and $p_{jnt}$ is the joint frame origin coordinates. Points on a part which is moving on a conveyor can be readily updated using a simple translational transformation based on conveyor motion. The points on each part of the robot 200 and the points on a portion of a workpiece 300, for a particular time step, are shown in the section 310 of FIG. 3. Two particular points, 330 and 332, are shown on the robot inner arm, and will be discussed below.

In section 320, each point on each part, from section 310, is transferred to a 3D occupancy grid space. A grid space 350 is defined in a workspace coordinate frame having an origin $\{O\}: [x_0\ y_0\ z_0]$. The grid space 350 is divided into individual 3D grid cells 352 having a size dimension u. For example, a robot workspace having a size of 1 meter in each of x, y and z dimensions could be divided into a grid space having dimensions of 200×200×200 with each grid having a size u=5 mm. The grid space 350 is shown in FIG. 3 as a set of y/z two-dimensional grids 360, 362 and 364, where each of the grids 360/362/364 is located at a different depth in the x direction. Each cell in the grid space 350 is assigned a 3D index—a triplet of integer numbers, with each of the numbers representing a locational position in the x, y or z direction. Examples of the 3D cell indices are shown below in section 370.

The points 330 and 332 on the robot inner arm are transferred to their corresponding locations in the grid space 350 as shown, based on the grid size u. Several other points (unnumbered) are also shown in the grid space 350. It is to be understood that each of the points on each of the parts is transferred to the grid space 350. This will typically be many thousands of points. Only a few are shown in FIG. 3 to maintain clarity of the illustration.

After the points are transferred to the grid space 350, occupied grid cells in the 3D grid space 350 are identified. At the right of section 320, three grid cells (340, 342, 344) are shaded to identify that they are occupied by a part at the time step currently being evaluated. The grid cells 340/342/344 are the cells containing points as indicated at the left.

In section 370, the occupied 3D grid cell indices are identified (at 380) and then converted to 1D indices (at 390). At 380, each of the cells in the grid space 350 is identified with a 3D index as described above. Then each point on each part is assigned to a grid cell. This may be done using a calculation of the form:

$$[i\ j\ k] = \text{round}\left(\frac{x-x_0}{u}\ \frac{y-y_0}{u}\ \frac{z-z_0}{u}\right) \quad (1)$$

Where [i j k] are the 3D indices of a grid cell corresponding to a point having coordinates (x y z) relative to the origin {O}: [$x_0\ y_0\ z_0$].

For example, the cell 340—which is occupied by more than one point above—has an index of (1, 3, 2) which indicates that it is the first cell (1) in the x-direction, the third cell (3) in the y-direction, and the second cell (2) in the z-direction. Likewise, the occupied cell 342 has an index of (1, 3, 3), and the occupied cell 344 has an index of (1, 4, 2). All cells in the grid space 350 are numbered with 3D indices accordingly, and occupied cells are identified. Only the occupied grid cells and a few others have their indices shown in the illustration at 380.

At 390, the 3D indices for the cells of the grid space 350 are converted to 1D indices. This may be done by simply sequentially numbering the cells, incrementing the grid cells in the z-direction while holding x and y constant, then incrementing y by one cell and repeating the march in the z-direction, and performing this repeatedly until the y-direction is exhausted, and then likewise the x-direction. In the 200×200×200 grid space example discussed above, the 3D indices would range from values of (1,1,1) to (200,200,200), and the 1D indices would range from a value of 1 to 8,000,000 (=200³). In the example shown at 390, the visible top layer of grid cells are numbered 1 through 12 by incrementing first in the z-direction, then the y-direction. The next layer down in the x-direction would have 1D indices of 13-24, and so forth.

At 390, the cells having 1D indices of 8, 9 and 11 are shaded to indicate they are occupied. These indices 8, 9 and 11 correspond to the cells 340/342/344 which were indicated as being occupied by the points 330 and 332 and other points in the grid space 350 in section 320. The 1D indices of occupied space (8, 9, 11) are saved as a 1D array defining occupancy for a particular part at a particular time step in the planned motion program. These 1D occupancy index arrays are then used in the swept volume and interference check computations (at 260 and 270, respectively) as discussed above with respect to FIG. 2.

Again, all of the steps of FIG. 3 are performed for each planned time step of robot motion. That is, the point coordinates for each part are first updated in section 310 to reflect each time step of planned object motion (robot parts and workpiece parts); then for each object at each time step, the point coordinates are transferred to grid space as 3D occupancy indices in section 320; and finally, the 3D occupancy indices are converted to 1D indices for each object for each time step in section 370.

As mentioned above, the 1D occupancy index arrays are used in the swept volume and interference check computations (260 and 270, respectively, in FIG. 2). If an interference is detected, it may be desirable for a human to visualize the interference condition with the robot(s) and other objects in their position in the workspace. This may be done by converting the 1D indices back to 3D geometry using the reverse process of the step 240. The resulting interference condition in 3D space may be superimposed on the robots/parts at the time step when the interference occurs. Likewise, swept volumes may be converted back to 3D geometry for visualization using the same technique.

A usage scenario for the disclosed interference checking method using point sets represented as 1D indices is to automatically perform the interference check for every planned robot motion path before the motion is executed. In other words, a planned motion of the robot or robots (e.g., for a welding or spray painting task) is computed, and the point set interference check computation is performed before the task is executed, based on locations and motions of any obstacles in the workspace—such as other robots, moving workpieces, and stationary objects. If the point set interference check computation identifies an interference, the task is not executed, and the robot motion is re-planned and the point set interference check computation is performed again.

The method described above, featuring conversion of 3D points to 1D indices, has speed and accuracy advantages over prior art techniques. In particular, the disclosed point set interference check method delivers faster computational times and requires less computer memory than interference check techniques using CAD models, and the point set interference check method provides better accuracy than interference check techniques which use geometry primitives.

Figure 4A:
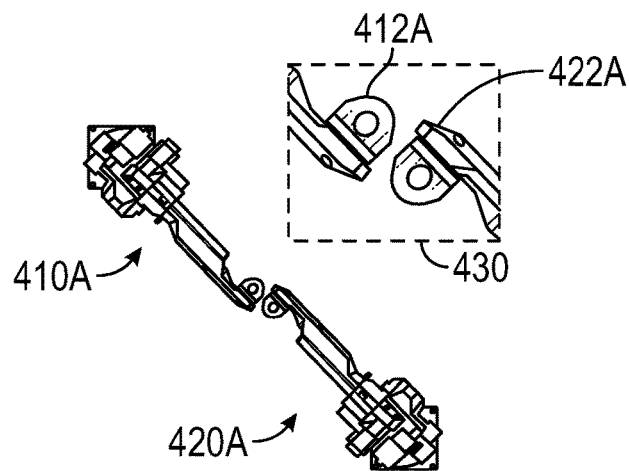
FIGS. 4A, 4B and 4C are illustrations showing interference check results using traditional CAD model geometry, geometry primitive approximations, and the point set technique of the present disclosure, respectively.
Figure 4B:
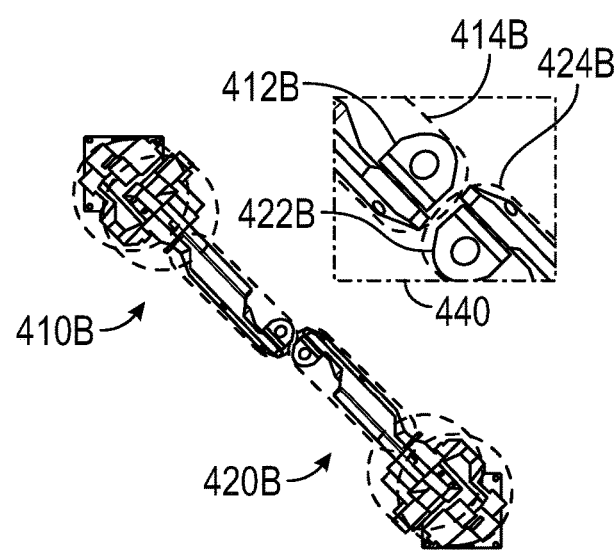
Figure 4C:
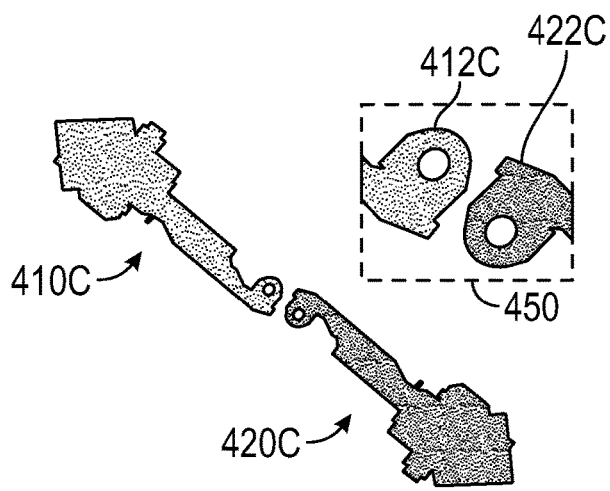

FIGS. 4A, 4B and 4C are illustrations showing interference check results using traditional CAD model geometry, geometry primitive approximations, and the point set technique of the present disclosure, respectively. The simulations depicted in FIGS. 4A, 4B and 4C all use the same robot kinematics and motions. Only the representation of the robot arm components used in the interference check are different between the three figures, with the effect on interference check results and computation times discussed below.

FIG. 4A shows part of a robot 410A in close proximity to part of a robot 420A. The robots 410A and 420A are represented by CAD model geometry. Inset 430 shows a close-up of a part 412A (of the robot 410A) and a part 422A (of the robot 420A). It can be seen in the inset 430 that there exists a small clearance between the part 412A and the part 422A; that is, there is no interference. The CAD model geometry of FIG. 4A enables accurate representation of the parts, and thus does not return a false positive interference condition when the parts are in close proximity. However, the CAD model geometry of FIG. 4A is extremely computationally intensive when used in an interference check calculation. In fact, interference checking using CAD model geometry of parts is typically too slow to be used in real-time motion planning routines where a planned path must be interference-checked within about 1-2 seconds so that robot motion can continue uninterrupted.

FIG. 4B shows part of a robot 410B in close proximity to part of a robot 420B. The robots 410B and 420B are represented by geometry primitives—such as a cylinder around a slender robot arm, etc. Inset 440 shows a close-up of a part 412B (of the robot 410B) and a part 422B (of the robot 420B). It can be seen in the inset 440 that there exists a small clearance between the actual part 412B and the part 422B; that is, there is no interference. However, the part 412B is represented by a geometry primitive 414B, and the part 422B is represented by a geometry primitive 424B. The geometry primitive 414B does interfere with the geometry primitive 424B at the time step shown in the inset 440. Therefore, the interference check calculation using geometry primitives predicts an interference, when in fact none exists between the actual parts of the robots. Although interference checking using geometry primitives offers much faster computation time than using CAD model geometry, FIG. 4B illustrates how the simplifications inherent in geometry primitives can lead to false positive interference condition predictions.

FIG. 4C shows part of a robot 410C in close proximity to part of a robot 420C. The robots 410C and 420C are represented by point sets according to the techniques of the present disclosure. Inset 450 shows a close-up of a part 412C (of the robot 410C) and a part 422C (of the robot 420C). It can be seen in the inset 450 that there exists a small clearance between the part 412C and the part 422C; that is, there is no interference. The point set interference check method of the present disclosure, like the CAD model geometry of FIG. 4A, enables accurate representation of the parts, and thus does not return a false positive interference condition when the parts are in close proximity. Furthermore, the point set interference check method offers interference check computation times fast enough to be used in real-time motion planning routines where a planned path must be interference-checked within about 1-2 seconds so that robot motion can continue uninterrupted.

FIGS. 4A-4C depict results of simulations which were all run on the same computing hardware in directly comparable tests. The CAD model geometry simulation of FIG. 4A required a significant amount of computation time to update a robot pose/configuration and perform the interference check at the new configuration; the computation took far too long to be useful in real-time motion planning. The geometry primitive simulation of FIG. 4B required less computation time to update the robot pose and perform the interference check at the new configuration than the CAD model geometry simulation. Although much faster than using CAD model geometry, the geometry primitive simulation can return erroneous results as discussed above. The point set simulation model of FIG. 4C required even less computation time than the geometry primitive technique—thus providing accurate interference check results and fast computations, a combination not available using prior art techniques.

Figure 5A:
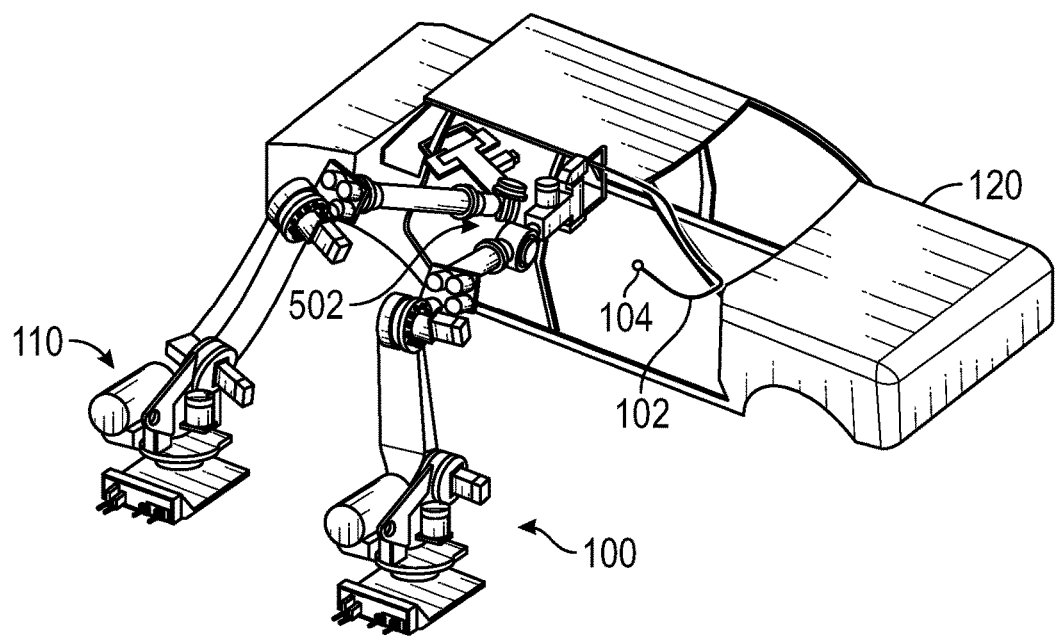
FIG. 5A is an illustration of the two industrial robots of FIG. 1A in a configuration where the point set interference check method has detected a collision.

FIG. 5A is an illustration of the two industrial robots 100 and 110 of FIG. 1A in a configuration where the point set interference check method has detected a collision. In FIG. 5A, the robots 100 and 110 are each performing spot welding tasks on the vehicle body 120. FIG. 5A shows the robots 100 and 110 during their planned motions, where each is moving on an independent path. The robot 100 has followed a tool center point path 102 from a start point 104 to the configuration where the robot 100 is shown. The robot 110 has followed its own tool center point path to reach the configuration where it is currently shown. At this point in the robot motions, the robots 100/110 would collide near the wrist joints and end-effectors, as indicated at 502. This interference condition was detected by a non-null intersection of the 1D index sets for the two robots at a particular step in the motion plan. The ability to quickly simulate and predict the interference condition, using the point set interference check method of the present disclosure, allows a revised motion plan to be computed and checked before the robots perform their tasks.

Figure 5B:
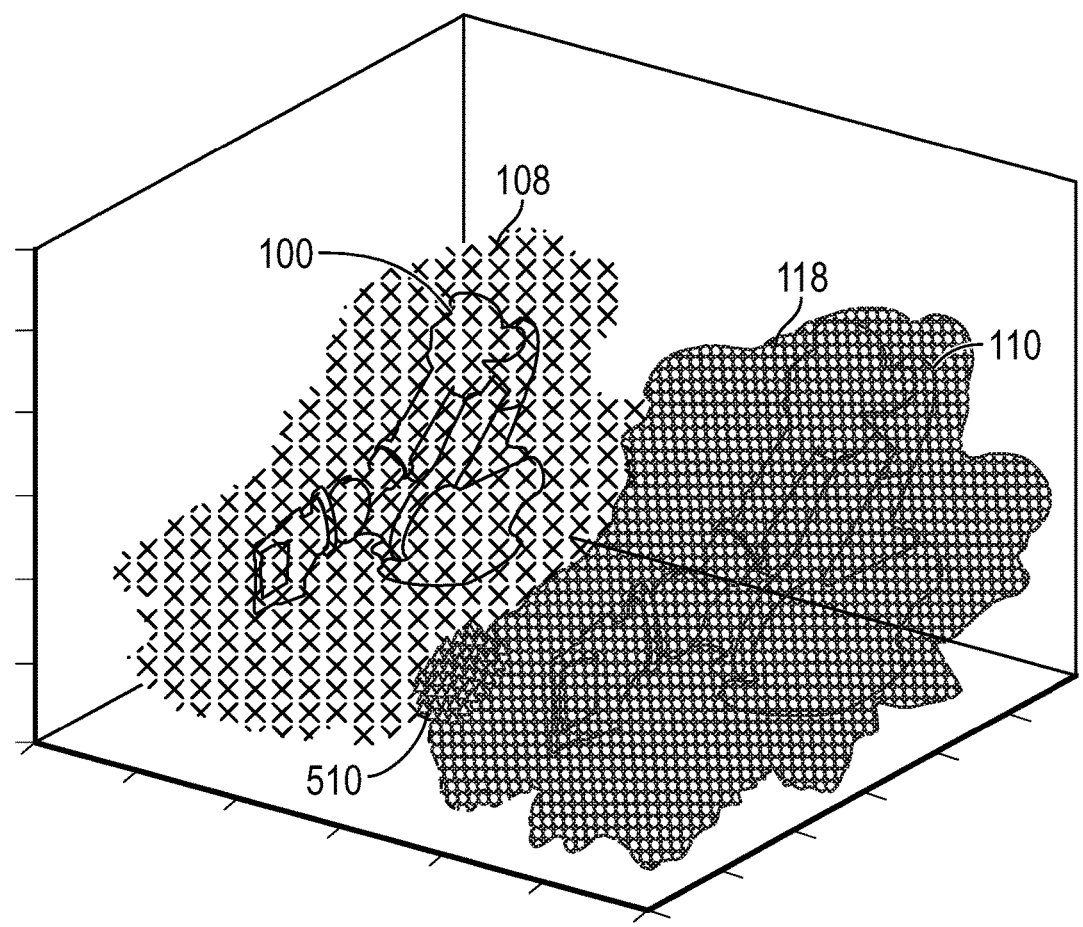
FIG. 5B is an illustration of swept volumes for the same two robots showing an overlap region of the volumes, according to an embodiment of the present disclosure.

FIG. 5B is an illustration of swept volumes for the same two robots 100 and 110, showing an overlap region of the volumes, according to an embodiment of the present disclosure. FIG. 5B shows the robots 100/110 from an opposite viewing perspective as FIG. 5A. The robots are shown in their home positions in FIG. 5B. Swept volumes 108 and 118 are computed using the techniques of the present disclosure. The swept volume 108 is the volume which is occupied at some point in the motion program of the robot 100, and the swept volume 118 is the volume which is occupied at some point in the motion program of the robot 110. The swept volume 108 is computed by performing a union of the 1D index sets for the robot 100 at all steps in the motion plan, and likewise the swept volume 118 for the robot 110. An overlap volume 510 is the space which is within both the swept volume 108 and 118. Although the overlap volume 510 does not necessarily indicate that a collision will occur, because the robots 100 and 110 may occupy that portion of their swept volumes at different times, the presence of the overlap volume 510 is of interest to a human programmer or operator, and the decision may be made to adjust the motion programs of the robots 100 and/or 110 to eliminate any overlap in their respective swept volumes. Again, the ability to quickly and accurately compute swept volumes and identify any overlap is beneficial to safe and reliable robot motion planning.

Figure 6:
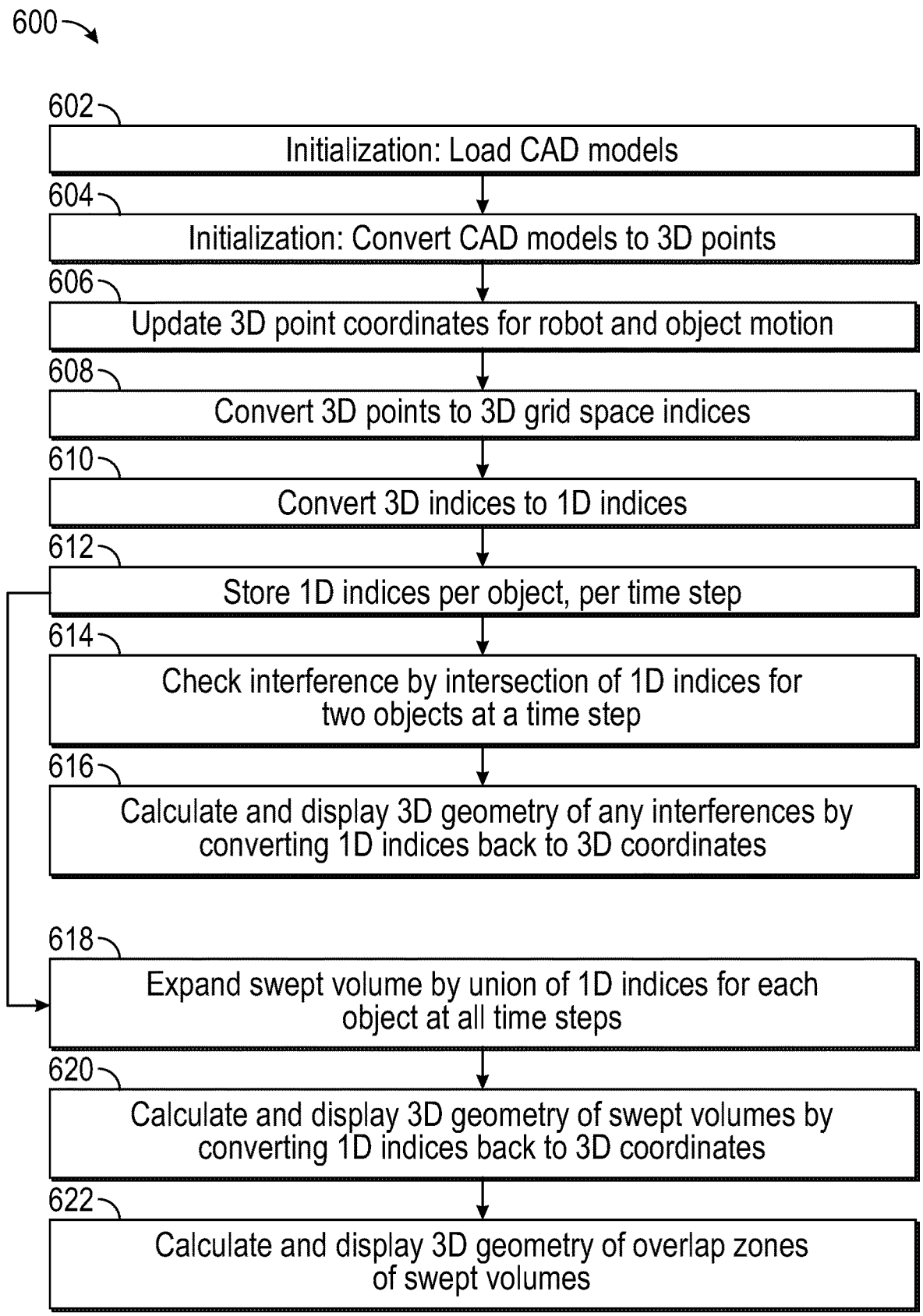
FIG. 6 is a flowchart diagram of a method for point set interference check and swept volume computation, according to an embodiment of the present disclosure.

FIG. 6 is a flowchart diagram 600 of a method for point set interference check and swept volume computation, according to an embodiment of the present disclosure. At box 602 CAD models of one or more robots and any potential obstacles are provided. Each separate component of the robot (inner arm, outer arm, end-effector, etc.) is provided as a separate CAD model, with position and orientation reference to joints which attach each part to another part of the robot. Potential obstacles include fixed and/or moving objects, and fixed and/or moving workpieces. At box 604, the CAD models are converted to 3D points defining exterior surfaces and some interior points on each part. Each part or component is typically represented by hundreds or thousands of points, where each point's position on each part is known such that the point's motion in a workcell coordinate frame can be computed based on robot joint motions. Providing the CAD models and converting the CAD models to 3D points, at the boxes 602 and 604, are initialization steps which are performed only once at the beginning of the point set interference check process.

At box 606, 3D point coordinates are updated for robot and part motion. That is, the coordinates of each point on each part of the robot are updated based on robot joint motions (each step in a motion plan), and the coordinates of each point on moving workpieces or obstacles are also updated based on the motions (planned) of those objects. At box 608, the 3D points on all robot parts and obstacles are transferred to 3D grid space indices. This step was discussed in detail with respect to FIG. 3. At box 610, the 3D indices are converted to 1D indices, as also discussed with respect to FIG. 3. As a result of this step, each object is represented by a set of 1D occupancy indices for a particular planned motion step or time step. Each 1D occupancy index is a single integer number representing a portion of the volume of the workspace within which the robot(s) operate.

At box 612, the 1D indices are stored as a set per object, per time step. As discussed relative to the example shown in FIG. 2, a set of multiple 1D indices (each an integer number) defines the occupancy of each object at each time step. Using the 1D occupancy index sets from the box 612, interference checks and swept volumes can be calculated.

At box 614, interference checking is accomplished by performing a mathematical intersection of a 1D index set for one object with a 1D index set for another object, at the same time step. For example, the 1D occupancy index set for a robot end-effector could be checked with the 1D index set for a machine (as in FIG. 1B); if the intersection of the two index sets is null, then there is no interference; if the intersection is non-null, then there is an interference. Likewise, the 1D occupancy index set for an entire robot (consisting of the indices for all of that robot's arm parts) could be intersected with the 1D occupancy index set for another entire robot; the intersections would be computed for each time step of both robots' motions, to identify any interference at any point in the motions.

At box 616, the 3D geometry of any interferences identified at the box 614 can be calculated by converting the 1D occupancy indices of the intersection set back to 3D indices, and back to 3D point coordinates, using the reverse of the process shown in FIGS. 2 and 3. The conversion of the interference index set back to 3D geometry—including display of the resulting 3D geometry—may be desirable so that a programmer or operator can visualize the configuration of the robot(s) when the interference occurs.

At box 618, swept volumes are computed by performing a union of the 1D occupancy index sets for an object (such as an entire robot) over all time steps of a motion program. This is again a very fast and easy computation, simply a mathematical union of the 1D index sets for multiple time steps, where each 1D index set is a group of integer numbers. The resulting swept volumes from this computation were illustrated in FIG. 5B, with the swept volume 108 for the robot 100 and the swept volume 118 for the robot 110.

At box 620, the 3D geometry of the swept volume computed at the box 618 can be calculated by converting the 1D occupancy indices of the union set back to 3D indices, and back to 3D point coordinates, using the reverse of the process shown in FIGS. 2 and 3. The conversion of the swept volume index set back to 3D geometry—including display of the resulting 3D geometry—may be desirable so that a programmer or operator can visualize the entire motion envelope of a robot during its motion program, or whether the motion envelopes of two adjacent robots overlap. At box 622, the 3D geometry of any overlap zones between separate swept volumes are calculated and displayed. For example, the overlap volume 510 shown in FIG. 5B depicts the overlap between the swept volumes of the robots 100 and 110. Overlap zones could be computed between the swept volumes of any two moving objects, whether a robot or otherwise.

Again, all of the steps of the method shown in FIG. 6 are programmed in an algorithm which runs on a computer having a processor and memory, which could be a robot controller or a workspace controller, as discussed above with respect to FIG. 2. A system which performs the point set interference check methodology includes at least one robot and its corresponding robot controller, and optionally may include a workcell controller or other computer, and optionally may include one or more object sensors to detect obstacle positions.

Throughout the preceding discussion, various computers and controllers are described and implied. It is to be understood that the software applications and modules of these computer and controllers are executed on one or more computing devices having a processor and a memory module. In particular, this includes a processor in each of the robot controllers and the optional workcell controller discussed above. Specifically, the processor in the robot controllers and/or the workcell controller is configured to perform the point set interference check techniques using 1D indices, and use the resulting interference check information in robot path planning computations in the manner described throughout the foregoing disclosure.

As outlined above, the disclosed techniques for robot interference checking using point sets represented as 1D indices improve the speed and accuracy of interference checking for robot path planning. The disclosed techniques avoid the up-front effort and inherent inaccuracy of modeling obstacles as geometry primitives, and enable rapid calculation of robot-to-robot and robot-to-obstacle interferences even when complex and arbitrarily-shaped obstacles are present.

While a number of exemplary aspects and embodiments of the robot interference checking technique using point sets represented as 1D indices have been discussed above, those of skill in the art will recognize modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A method for robot-obstacle interference checking, said method comprising:
   creating, on a computer having a processor and memory, three dimensional (3D) points defining space occupied by objects including at least one robot and one or more obstacles;
   updating coordinates of the 3D points of the at least one robot based on robot joint positions at each step in a planned motion program;
   converting the 3D points for each of the objects to 3D indices defining workspace grid cell occupancy, for each step in the planned motion program;
   converting the 3D indices for each of the objects to 1D indices defining workspace grid cell occupancy;
   storing the 1D indices as a set for each of the objects at each step in the planned motion program; and
   performing an interference check by computing an intersection, on the computer, of the set of 1D indices for the at least one robot and the set of 1D indices for another one of the objects at a step in the planned motion program.

2. The method according to claim 1 wherein a non-null intersection indicates that an interference condition exists.

3. The method according to claim 1 wherein at least one of the obstacles is a moving obstacle, and coordinates of each of the 3D points of the moving obstacle are updated at each step in the planned motion program.

4. The method according to claim 1 wherein the objects include a second robot, and coordinates of each of the 3D points of the second robot are updated at each step in the planned motion program.

5. The method according to claim 4 wherein the interference check is performed between the at least one robot and the second robot at each step in the planned motion program.

6. The method according to claim 1 wherein converting the 3D points to 3D indices includes defining a 3D workspace grid space comprising cells having a defined size in each grid space dimension, assigning a 3D index to each of the cells, and defining workspace grid cell occupancy based on a location of one or more of the 3D points within a cell.

7. The method according to claim 6 wherein assigning a 3D index to each of the cells includes assigning each value in the 3D index based on a cell's sequential position in each grid space dimension.

8. The method according to claim 1 wherein converting the 3D indices to 1D indices includes assigning a 1D index as an integer number in a sequence, counting through a first grid space dimension to completion while holding second and third grid space dimensions constant, and recursively incrementing the second and third grid space dimensions until all of the 3D indices are assigned a 1D index.

9. The method according to claim 1 further comprising, when an interference condition exists, converting the 1D indices of an intersection set to 3D indices, and converting the 3D indices of the intersection set to 3D points.

10. The method according to claim 1 further comprising calculating a swept volume by computing a union, on the computer, of the set of 1D indices for the robot for all steps in the planned motion program.

11. The method according to claim 10 further comprising converting the 1D indices of the swept volume to 3D indices, and converting the 3D indices of the swept volume to 3D points.

12. The method according to claim 1 further comprising commanding the at least one robot to execute the planned motion program when the interference check returns a null intersection indicating that no interference condition exists.

13. The method according to claim 1 wherein creating 3D points includes providing a CAD model of each of the objects and defining a plurality of points on a surface and/or an interior of each of the objects.

14. A method for interference checking a multi-robot system, said method comprising:
  creating, on a computer having a processor and memory, three dimensional (3D) points defining space occupied by each part of first and second robots operating in a workcell;
  updating coordinates of each of the 3D points of each of the robots based on robot joint positions at each step in a planned motion program for the multi-robot system;
  converting the 3D points for each of the robots to 3D indices defining workspace grid cell occupancy, for each step in the planned motion program;
  converting the 3D indices for each of the robots to 1D indices defining workspace grid cell occupancy;
  storing the 1D indices as a set for each of the robots at each step in the planned motion program; and
  performing an interference check by computing an intersection, on the computer, of the set of 1D indices for the first robot and the set of 1D indices for the second robot at each step in the planned motion program.

15. The method according to claim 14 further comprising calculating a swept volume for each of the first and second robots by computing a union, on the computer, of the set of 1D indices for each of the first and second robots separately for all steps in the planned motion program, and converting the 1D indices of the swept volumes to 3D indices, and converting the 3D indices of the swept volumes to 3D points.

16. The method according to claim 14 further comprising commanding the first and second robots to execute the planned motion program when the interference check returns a null intersection indicating that no interference condition exists.

17. A method for robot-obstacle interference checking, said method comprising:
  creating, on a computer having a processor and memory, three dimensional (3D) points defining space occupied by each part of a robot and another object;
  updating coordinates of each of the 3D points of the robot based on robot joint positions at each step in a planned motion program;
  converting the 3D points for the robot and the object to 3D indices defining workspace grid cell occupancy, for each step in the planned motion program;
  converting the 3D indices for the robot and the object to 1D indices defining workspace grid cell occupancy;
  storing the 1D indices as a set for the robot and the object at each step in the planned motion program; and
  performing an interference check by computing an intersection, on the computer, of the set of 1D indices for the robot and the set of 1D indices for the object at each step in the planned motion program.

18. The method according to claim 17 wherein the object is a fixed or moving obstacle in a workspace of the robot, and when the object is a moving obstacle, coordinates of each of the 3D points of the object are updated at each step in the planned motion program.

19. The method according to claim 17 wherein the object is a second robot, and coordinates of each of the 3D points of the second robot are updated at each step in the planned motion program.

20. The method according to claim 17 wherein the object is a machine which is being tended by the robot, and coordinates of each of the 3D points of moving parts of the machine are updated at each step in the planned motion program.

* * * * *